United States Patent
Peschl et al.

(10) Patent No.: US 8,576,047 B2
(45) Date of Patent: Nov. 5, 2013

(54) MOTOR VEHICLE OUTSIDE DOOR HANDLE WITH A SENSOR MODULE

(75) Inventors: Andreas Peschl, Velbert (DE); Stefan Neuhoff, Essen (DE); Marion Kilian, Velbert (DE)

(73) Assignee: Huf Hulsbeck & Furst GmbH & Co. KG, Velbert (DE)

(*) Notice: Subject to any disclaimer, the term of this patent is extended or adjusted under 35 U.S.C. 154(b) by 299 days.

(21) Appl. No.: 12/921,773

(22) PCT Filed: Jan. 30, 2009

(86) PCT No.: PCT/EP2009/051087
§ 371 (c)(1),
(2), (4) Date: Sep. 9, 2010

(87) PCT Pub. No.: WO2009/112310
PCT Pub. Date: Sep. 17, 2009

(65) Prior Publication Data
US 2011/0025522 A1   Feb. 3, 2011

(30) Foreign Application Priority Data
Mar. 13, 2008 (DE) .......... 10 2008 000 650

(51) Int. Cl.
*G08B 29/00* (2006.01)
(52) U.S. Cl.
USPC ......... 340/5.72; 340/5.7; 340/686.6; 340/5.2; 340/686.1; 180/287; 180/271; 180/289
(58) Field of Classification Search
USPC ......... 340/686.6, 686.1, 540, 500, 561, 562, 340/426.28
See application file for complete search history.

(56) References Cited

U.S. PATENT DOCUMENTS

| | | | |
|---|---|---|---|
| 6,740,834 B2 * | 5/2004 | Sueyoshi et al. | 200/600 |
| 6,847,289 B2 | 1/2005 | Pang et al. | |
| 7,233,080 B2 * | 6/2007 | Garnault et al. | 307/10.2 |
| 2003/0107473 A1 * | 6/2003 | Pang et al. | 340/5.72 |
| 2004/0217601 A1 * | 11/2004 | Garnault et al. | 292/336.3 |

FOREIGN PATENT DOCUMENTS

| | | |
|---|---|---|
| DE | 102 12 794 A1 | 6/2003 |
| DE | 10 2005 031 441 A1 | 1/2007 |
| DE | 102005031441 A1 * | 1/2007 |
| DE | 10 2006 029 771 A1 | 1/2008 |
| WO | WO 02/33203 A1 | 4/2002 |
| WO | WO 2005/008003 A1 | 1/2005 |
| WO | WO 2008/107046 A1 | 9/2008 |

* cited by examiner

*Primary Examiner* — Brian Zimmerman
*Assistant Examiner* — Kevin Lau
(74) *Attorney, Agent, or Firm* — Blakely Sokoloff Taylor & Zafman

(57) ABSTRACT

A motor vehicle outside door handle with a wall surrounding an interior space, a first sensor electrode of a first capacitive sensor for triggering a final locking operation, a second sensor electrode of a second capacitive sensor for triggering a locking operation, and an evaluation circuit, which is connected to the first sensor electrode. The second sensor electrode is arranged in the interior space. The first sensor electrode, the second sensor electrode and the evaluation circuit are accommodated in a single sensor module which can be inserted into the interior space. The sensor module has a flat plastic trough which has a bottom wall and is open on one side. A printed circuit board provided with connecting cables is placed into the plastic trough filled with a plastics compound. The sensor electrodes are formed by metal-coated layers of the printed circuit board or by metal bodies mounted on the printed circuit board.

8 Claims, 2 Drawing Sheets

MOTOR VEHICLE OUTSIDE DOOR HANDLE WITH A SENSOR MODULE

This is a non-provisional application claiming the benefit of International application number PCT/EP2009/051087 filed Jan. 30, 2009.

BACKGROUND OF THE INVENTION

The invention concerns an outer motor vehicle door handle with a wall that surrounds an inner space, a first sensor electrode of a first capacitive sensor to trigger an unlocking process when detecting the approach of a part of the operator's body to a space that is formed between the outer door handle and a door wall, particularly when detecting the entry of a part of the operator's body into the space that is formed between the outer door handle and the door wall, a second sensor electrode of a second capacitive sensor to trigger a locking process when detecting the approach of a part of the operator's body to a specified location on an outer area of the outer door handle that faces away from the door wall, and an evaluation circuit that is arrayed in the inner space and connected to the sensor electrode and the second sensor electrode.

In known outer motor vehicle door handles of the initially described type, the first sensor electrode commonly consists of a metal plate or metal foil which is arrayed within the door handle near the surface of the door handle which faces inward (that is, towards the wall of the door). This sensor electrode is connected to a conductor plate on which components of evaluation electronics are arrayed via input leads. Furthermore a second sensor is connected with the conductor plate via input leads; this sensor detects the approach of a finger of the operator to a specified area of an outer surface of the door handle, specifically a touch on this specified area, in order to trigger a locking process when this approach, and specifically this touch, is detected. The sensor which triggers the locking process may also be mounted directly on the conductor plate. This sensor may, for instance, consist of a piezoelectrical sensor, a key or a capacitive sensor. In known arrays which use a capacitive sensor here, the metal electrode of this capacitive sensor is arrayed behind a thinned area of the wall of the door handle. Herein it is possible that a film of moisture forms between the metal electrode and the inner surface of the door handle wall, negatively influencing the sensitivity of the sensor.

In known door handle arrays, the conductor plate which bears the components and the sensor surfaces which are connected to it via input leads are initially inserted into an inner space in the door handle. Then the inner space is filled with a pourable mass. This is done via an opening on a face side of the door handle, so that the pourable mass flows into the longitudinal direction of the door handle and into the inner space of the door handle. This assembly is relatively complicated.

SUMMARY OF THE INVENTION

Based on the described state of the art, the invention is based upon the task of simplifying the production of an outer motor vehicle door handle of the initially described type. The invention solves this task with an outer motor vehicle door handle possessing the attributes of claim 1.

In the outer motor vehicle door handle of the initially described type in accordance with the invention, the first sensor electrode, the second sensor electrode and the evaluation circuit are housed in a single sensor module which can be inserted into the inner space. The sensor module possesses a flat plastic tub which has a bottom wall and is open on one side, wherein a conductor plate that is provided with connection cables is laid into the plastic tub and the plastic tub is filled with a pourable plastic mass. Herein the pouring process is very generally intended to refer to a process in which the spaces in the plastic tub which surround the conductor plate and components are filled, for instance by gravity pouring or injection molding. The sensor electrodes are formed by metallization layers of the conductor plate or by metal bodies mounted on the conductor plate, wherein the metal surfaces of the sensor electrodes are arrayed on conductor plate areas which are side by side and/or at least one metal surface is arrayed at a gap from the conductor plate. The process of triggering an unlocking process in the sense of the invention also includes partial processes of the unlocking process, such as triggering an authorization query. The same applies to triggering the locking process.

The fact that all sensor components are housed in the compact sensor module and the manner in which the sensor module is formed permit simple production, since the circuit is easily covered by simply filling the plastic tub with pourable material; furthermore the process of pouring into a plastic tub which is open on one side can be performed more quickly than the known process of pouring into a door handle in a longitudinal direction. Furthermore, the sensor module allows higher reliability, since the open side of the plastic tub is the only surface that is at risk of leaks.

A preferred further embodiment consists of a form wherein the first sensor electrode is formed by a first metal body that is mounted on the conductor plate or by a metallization layer of the conductor plate, that components of the evaluation circuit and a second metal body which serves as a second sensor electrode are mounted on the conductor plate, and that the second metal body is arrayed with a gap from the conductor plate and protrudes into a hollow space in the floor wall of the plastic tub which is adapted to the dimensions of the second metal body. This has the advantage that it becomes easier to move the second sensor electrode away from the first sensor electrode and therefore easier to separately detect the response of the sensors, and that the second sensor electrode can be moved closer to the surface of the activating surface, so that it is possible to set a lower sensitivity of the second sensor.

A further preferred embodiment consists of a form in which the sensor module is arrayed in the inner space of the outer door handle so that a wall segment of the bottom wall of the plastic tub of the sensor module which protrudes to the outside passes through an opening in the wall of the outer door handle, herein defining the specified location for triggering the locking process. This particularly contributes to increased reliability, since the protruding wall segment which passes through the wall of the outer door handle directly forms the activating surface of the sensor triggering the locking process which must be touched by the operator. It is not possible for a film of moisture to form within the sensor module, and the moisture film which may form on the outer surface of the bottom wall of the sensor module is directly wiped away by the body part of the operator, or pushed away to a degree which makes it possible to securely detect the touch. A lasting persistence of an interfering moisture film between the touch surface and the sensor electrode is no longer possible. A preferred further form of this embodiment consists of a form wherein the first sensor electrode is formed by a first metal body that is mounted on the conductor plate or by a metallization layer of the conductor plate, that components of the evaluation circuit and a second metal body which serves as a second sensor electrode are mounted on the conductor plate, and that the second metal body is arrayed with a gap from the conductor plate and protrudes into a hollow space in the floor wall of the plastic tub which is adapted to the dimensions of the second metal body, wherein the indentation which receives the second metal body is arrayed adjacently to the outwardly protruding wall segment of the sensor module. The second metal body preferably possesses a level sheet metal segment which lies flat against a level inner surface of the bottom wall in the indentation. Then the thickness of the bottom wall in this area determines the distance between the metal surface of the sensor and the operator's finger when operating the locking sensor.

A preferred further embodiment of the outer motor vehicle door handle consists of a form wherein the first sensor electrode is formed by a metallization layer on a first surface of the conductor plate and the components of the evaluation circuit are mounted on the opposite second surface of the conductor plate. This permits a smaller construction size of the sensor module. Herein the second surface of the conductor plate preferably faces the bottom wall of the plastic tub. Therefore, the first surface of the conductor plate which bears the first sensor electrode is then arrayed directly below the surface of the pourable mass on the open side of the plastic tub. The construction space within which the components of the evaluation circuit are located results in a distance of the first sensor electrode that is arrayed on the conductor plate from the second sensor electrode that is arrayed on the side of the components in the indentation of the bottom wall, and therefore disconnects them.

A preferred further embodiment of the outer motor vehicle door handle consists of a form wherein the conductor plate possesses two conductor plate segments which are arrayed behind each other in the plastic tub when the sensor module is mounted in the longitudinal direction of the handle, wherein one conductor plate bears the metallization layer that serves as the first sensor electrode and the second conductor plate segment bears the components of the evaluation circuit and the second metal body. This also results in a greater distance between the two sensor electrodes, which permits better evaluation and differentiation of the capacity changes detected by the sensor electrodes. The components of the evaluation circuit are preferably mounted on the second surface of the conductor plate in such a manner that they are at least partially covered by the second metal body. This permits a smaller construction size of the sensor module.

The second metal body preferably possesses a sheet metal segment that lies against the bottom of the indentation, wherein the construction space for the components is located between this sheet metal segment and the conductor plate, wherein the adjacent conductor plate segment contains the metallization layer that forms the first sensor electrode.

In a preferred embodiment, the wall of the outer door handle is divided into two halves of the handle extending into the longitudinal direction of the handle, with the sensor module being mounted between them. The opening in the wall of the outer door handle to receive the protruding wall section of the sensor module is herein preferably formed by two opening halves of the two halves of the door handle.

Advantageous and/or preferred further embodiments of the invention are described in the sub-claims.

BRIEF DESCRIPTION OF THE DRAWINGS

The following text describes the invention in further detail using the preferred exemplary embodiments that are shown in the diagrams. The diagrams show.

DETAILED DESCRIPTION OF THE INVENTION

Figure 1:
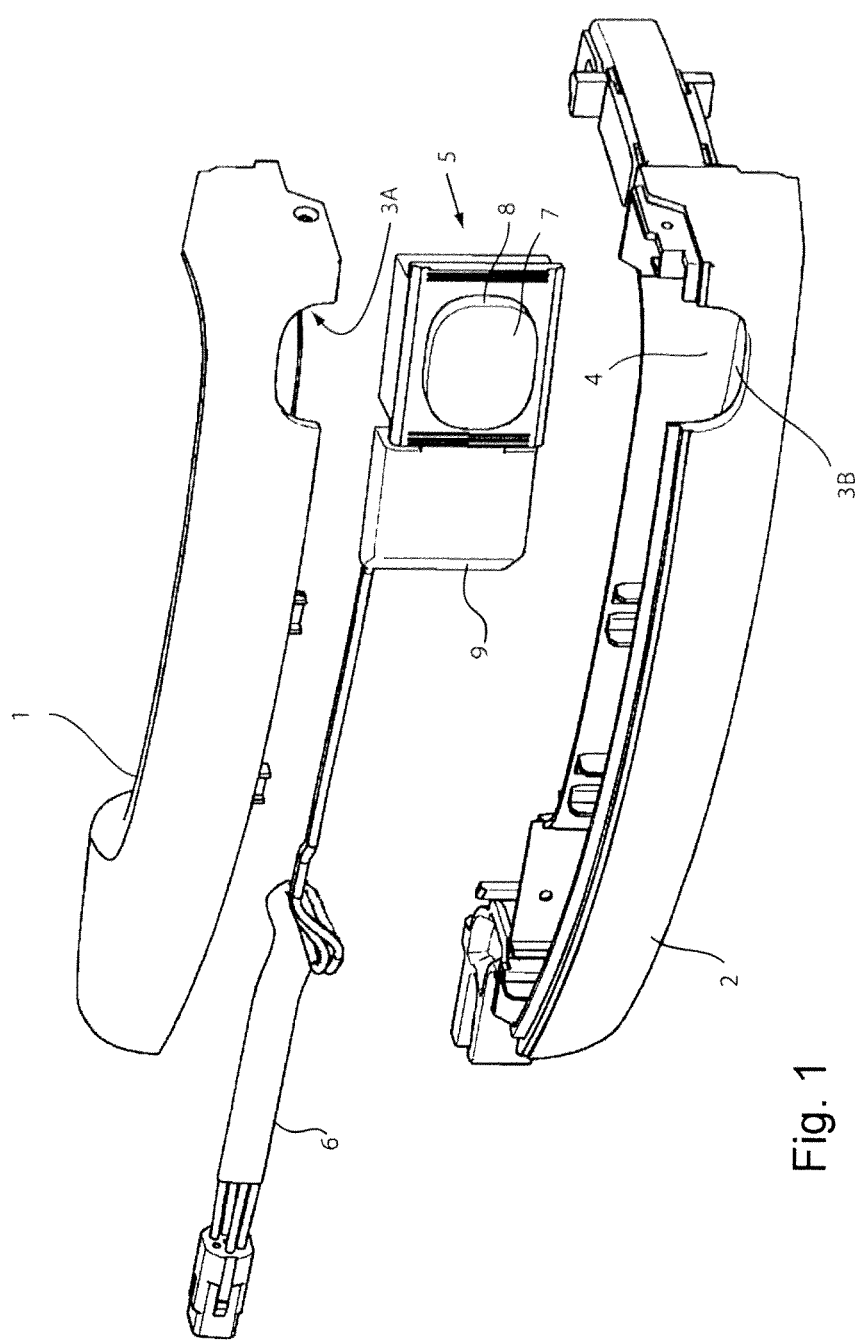
FIG. 1 shows an explosion diagram of an embodiment of the outer motor vehicle door handle in accordance with the invention and FIG. 2 shows a schematic sectional view of the sensor module.

In the preferred exemplary embodiment of the outer motor vehicle door handle in accordance with the invention as shown in FIG. 1, a sensor module 5 is placed within an inner space 4 between two handle halves 1, 2. Input leads 6 which are connected with the sensor module 5 are brought through the inner space 4 within the handle halves 1 and 2 in such a manner that they come out of the handle behind a door wall (not shown in FIG. 1) within the interior of a motor vehicle door. There, the input leads 6 are connected to a power supply and control device (also not shown).

The sensor module 5 consists of a plastic tub 9 which is open towards a side not visible in FIG. 1, in which a first sensor electrode of a first capacitive sensor (for triggering an unlocking process when detecting the entry of a body part of the operator into an inner space formed between the outer door handle and a door wall), a second sensor electrode of a second capacitive sensor (for triggering a locking process when detecting the approach of a body part of the operator to a specified location on an outer surface of the outer door handle facing away from the door wall) and an evaluation circuit that is connected to the first and second sensor electrodes. The first sensor electrode is located in the sensor module 5 near the open side of the plastic tub 9 which is not visible in FIG. 1. After the installation of the sensor module 5 into the door handle halves 1 and 2, the first sensor electrode for triggering the unlocking process is therefore arrayed near the inner surfaces of the outer door handle. The second sensor electrode for the locking process is located directly behind a protruding wall segment 8 of the bottom wall of the plastic tub 9 of the sensor module 5. The sensor module 5 is mounted into the door handle halves 1, 2 in such a manner that the protruding segment 8 of the bottom wall of the plastic tub 9 passes through an opening which is formed by the two partial openings 3A and 3B of the handle halves 1, 2. Therefore, the surface 7 of the sensor module 5 is located directly at the outer surface of the motor vehicle door handle.

Figure 2:
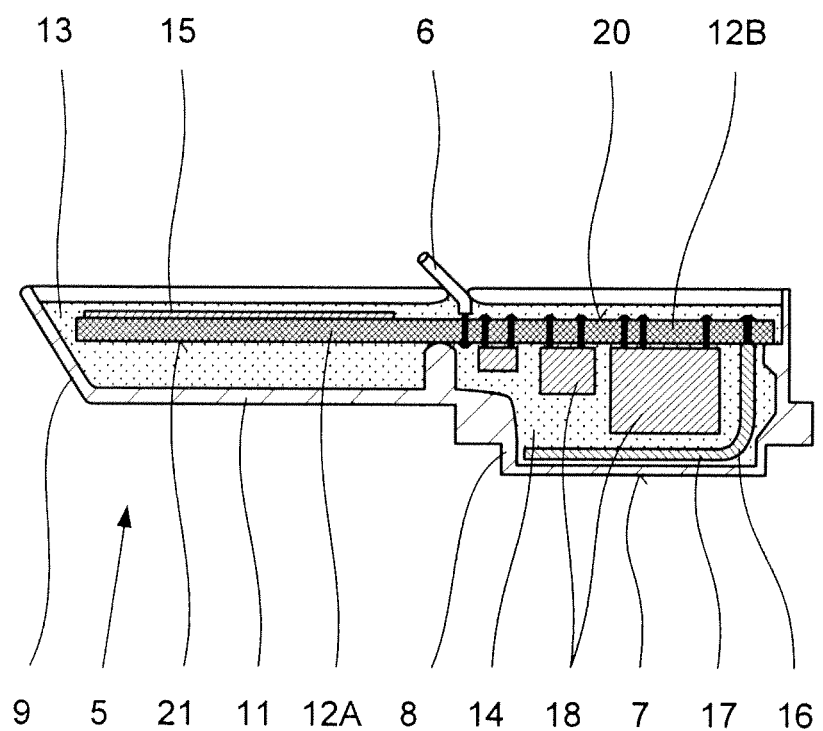

FIG. 2 shows a schematic sectional view through the sensor module 5. The sensor module 5 possesses a plastic tub 9 in which both a first sensor electrode and a second sensor electrode as well as the corresponding evaluation circuits are housed. A conductor plate is embedded in the plastic tub 9; it possesses a first conductor plate segment 12A and a second conductor plate segment 12B as well as a first surface 20 and a second surface 21 which faces the bottom wall 11 of the plastic tub 9. On the first conductor plate surface 20, the metallization layer in the area of the first conductor plate segment 12A is structured so that a large-surface first sensor electrode 15 of a capacitive sensor is formed there. In the second conductor plate segment 12B, components 18 of the evaluation circuit are mounted on the second conductor plate surface 21. Furthermore, a metal body 16 is mounted in this second conductor plate segment 12B, which, with a sheet metal segment 17, covers a part of the components 18, wherein the segment 17, in the exemplary embodiment shown in FIG. 2, is largely oriented parallel to the conductor plate 12A, 12B. The metal body 16 with the sheet metal segment 17 protrudes into an indentation 14 of the bottom wall 11 of the plastic tub 9 which is adapted to the dimensions of the metal body 16. The indentation 14 in the bottom wall 11 forms a wall segment 8 of the plastic tub 9 which protrudes outward (downward in FIG. 2). The protruding wall segment 8 of the plastic tub 9 possesses a level bottom whose outer surface 7, in the mounted state of the sensor module 5, defines the location which must be touched by an operator in order to trigger a locking process. Within the indentation 15, the sheet metal segment 17 of the metal body 16 largely lies parallel against the bottom wall. Depending on the thickness of the bottom wall, the sensitivity of the capacitive sensor which possesses the partial body 16 as a sensor electrode is adjusted so that this sensor responds only when a body part of the operator (such as a finger) touches the outer surface 7 of the sensor module 5. The sensitivity of the other (first) capacitive sensor which uses the metallization layer 15 as a sensor electrode is higher, and set so that this capacitive sensor is able to detect the insertion of a body part of the operator (the hand) into the inner space between the outer door handle and the wall of the motor vehicle door (not shown in FIG. 1). A control logic system which may, for instance, be partially implemented in the components 18 of the evaluation circuit ensures that it is possible to differentiate the activation of the first and second capacitive sensors from each other, and detect them securely. In alternative embodiments of the sensor module 5, a further metal body might be used as a sensor electrode of the first capacitive sensor instead of the metallization layer 15. In place of the metal body 16 of the second capacitive sensor, a flexible conductor plate with a metallization layer might also lie against the bottom of the sensor module 5. The conductor plate 12A, 12B itself might also be flexible. The components 18 of the evaluation circuit might also be mounted in the first conductor plate segment 12A or in both conductor plate segments 12A, 12B. In an alternatively structured plastic tub 9, it would also seem feasible that the sensor electrodes which are formed by sheet metal segments are arrayed at a specified angle in relation, to the conductor plate 12A, 12B.

The components inserted in the plastic tub 9 of the sensor module 5 (12A, 12B, 15, 16, 17, 18) are surrounded by a pourable plastic mass 13. Using a pourable mass to cover the components can be simply realized in one embodiment by filling a plastic tub 9 which lies horizontally in a holding device with installed components is filled from the open top with a liquid plastic material, wherein the plastic material subsequently hardens. Alternatively, it also seems feasible to use an injection molding process. The plastic mass 13 is preferably filled into the tub 9 in a manner which avoids air inclusions or empty spaces.

In the exemplary embodiment shown in FIG. 2, the first sensor electrode 15 (metallization layer of the conductor plate segment 12A) and the second sensor electrode 17 (metal body 16 mounted on the second conductor plate segment 12B) are arrayed in an offset arrangement in the longitudinal direction of the handle. On the one hand, this has the advantage that the first sensor electrode is moved closer to the location in which it is most likely for the operator's hand to reach behind the handle, so that the sensitivity of the first capacitive sensor can be reduced. Second, this has the advantage of disconnecting the first and second capacitive sensors from each other. In an alternative exemplary embodiment, however, both the first and the second sensor electrodes might be formed by one metal body each, which are mounted within the same conductor plate segment, but on opposing sides of the conductor plate.

We claim:
1. Outer motor vehicle door handle with
   a wall surrounding an inner space,
   a first capacitive sensor electrode of a first capacitive sensor to trigger an unlocking process when detecting the approach of a part of the operator's body to a space formed between the outer door handle and a door wall,
   a second sensor electrode of a second capacitive sensor to trigger a locking process when detecting the approach of a body part of the operator to a specified location on an outer surface of the outer door handle that faces away from the wall of the door, and
   an evaluation circuit that is connected to the first sensor electrode and the second sensor electrode and arrayed within the inner space,
   wherein
   the first sensor electrode, the second sensor electrode and the evaluation circuit are housed within a single sensor module which can be placed within the inner space,
   the sensor module possesses a flat plastic tub which has a bottom wall and is open on one side, wherein a conductor plate that is provided with connection cables is laid into the plastic tub and the plastic tub is filled with a pourable plastic mass,
   the first sensor electrode is formed by metallization layers on a first side of the conductor plate, the second sensor electrode is formed by a metal body mounted on a side opposite the first side of the conductor plate and includes a metal surface which is arranged to form a gap between said metal surface and said opposite side of the conductor plate, wherein said evaluation circuit is disposed within said gap, and
   the sensor module is arrayed in the inner space of the outer door handle so that a wall segment of the bottom wall of the plastic tub of the sensor module which protrudes to the outside passes through an opening in the wall of the outer door handle, said wall segment defining the specified location for triggering the locking process.

2. Outer motor vehicle door handle in accordance with claim 1, wherein the metal body protrudes into an indentation which is adapted to the dimensions of the metal body in the bottom wall of the plastic tub.

3. Outer motor vehicle door handle in accordance with claim 1, wherein
   components of the evaluation circuit are mounted on the conductor plate, and
   the metal body protrudes into an indentation which is adapted to the dimensions of the metal body in the bottom wall of the plastic tub with a gap from the conductor plate, wherein the indentation which receives the metal body is arrayed adjacent to the outwardly protruding wall segment of the sensor module.

4. Outer motor vehicle door handle in accordance with claim 2, wherein the metal body has a level sheet metal segment which lies flat against a level inner surface of the bottom wall within the indentation.

5. Outer motor vehicle door handle in accordance with claim 1, wherein the side opposite the first side of the conductor plate faces the bottom wall of the plastic tub.

6. Outer motor vehicle door handle in accordance with claim 5, wherein the conductor plate possesses two conductor plate segments which are arrayed behind each other in the plastic tub when the sensor module is mounted in the longitudinal direction of the handle, wherein one conductor plate segment bears the metallization layer that serves as the first sensor electrode and the second conductor plate segment bears the components of the evaluation circuit and the metal body.

7. Outer motor vehicle door handle in accordance with claim 5, wherein the components of the evaluation circuit are mounted on the side opposite the first side of the conductor plate so that they are at least partially covered by the metal body.

8. Outer motor vehicle door handle in accordance with claim 1, wherein the wall of the outer door handle is divided into two handle halves which extend into the longitudinal direction of the door handle and between which the sensor module is mounted.

* * * * *